(12) United States Patent
Rao et al.

(10) Patent No.: US 10,923,647 B2
(45) Date of Patent: Feb. 16, 2021

(54) CO-EXTRUSION PRINTING OF FILAMENTS FOR SUPERCONDUCTING WIRE

(71) Applicants: PALO ALTO RESEARCH CENTER INCORPORATED, Palo Alto, CA (US); ENERGY-TO-POWER SOLUTIONS (e2P), Knoxville, TN (US)

(72) Inventors: Ranjeet Rao, Redwood City, CA (US); Christopher Marek Rey, Knoxville, TN (US)

(73) Assignees: PALO ALTO RESEARCH CENTER INCORPORATED, Palo Alto, CA (US); ENERGY-TO-POWER SOLUTIONS (E2P), Knoxville, TN (US)

( * ) Notice: Subject to any disclaimer, the term of this patent is extended or adjusted under 35 U.S.C. 154(b) by 0 days.

(21) Appl. No.: 16/017,051

(22) Filed: Jun. 25, 2018

(65) Prior Publication Data
US 2018/0309041 A1 Oct. 25, 2018

Related U.S. Application Data

(62) Division of application No. 14/699,936, filed on Apr. 29, 2015, now abandoned.

(51) Int. Cl.
*H01L 39/24* (2006.01)
*H01L 39/14* (2006.01)

(52) U.S. Cl.
CPC ........ *H01L 39/2487* (2013.01); *H01L 39/141* (2013.01)

(58) Field of Classification Search
CPC ................. H01L 39/2487; H01L 39/141
See application file for complete search history.

(56) References Cited

U.S. PATENT DOCUMENTS

| | | | |
|---|---|---|---|
| 3,195,865 | A | 7/1965 | Harder |
| 3,371,695 | A | 3/1968 | Lamb |
| 3,382,534 | A | 5/1968 | Veazey |
| 3,556,833 | A | 1/1971 | Nirenberg |
| 3,583,678 | A | 6/1971 | Harder |
| 3,752,616 | A | 8/1973 | Matsui et al. |

(Continued)

FOREIGN PATENT DOCUMENTS

| | | |
|---|---|---|
| EP | 0802034 | 10/1997 |
| EP | 1757429 | 2/2007 |

(Continued)

OTHER PUBLICATIONS

Espacenet machine translation (description only) of FR 1384293A, translated May 8, 2015.

(Continued)

*Primary Examiner* — Paul A Wartalowicz
(74) *Attorney, Agent, or Firm* — Miller Nash Graham & Dunn LLP

(57) ABSTRACT

A method of manufacturing a superconducting tape includes forming a slurry of superconducting material, forming a slurry of sacrificial material, extruding the slurries of superconducting and sacrificial materials as interdigitated stripes onto a substrate, and removing the sacrificial material to form superconducting filaments.

14 Claims, 4 Drawing Sheets

(56) References Cited

U.S. PATENT DOCUMENTS

| | | | |
|---|---|---|---|
| 3,860,036 A | 1/1975 | Newman, Jr. | |
| 3,949,970 A | 4/1976 | ter Braak | |
| 4,112,520 A | 9/1978 | Gilmore | |
| 4,222,671 A | 9/1980 | Gilmore | |
| 4,511,528 A | 4/1985 | Kudert et al. | |
| 5,094,793 A | 3/1992 | Schrenk et al. | |
| 5,143,681 A | 9/1992 | Daubenbuchel et al. | |
| 5,154,934 A | 10/1992 | Okamoto | |
| 5,628,950 A | 5/1997 | Schrenk et al. | |
| 5,843,385 A | 12/1998 | Dugan | |
| 5,851,562 A | 12/1998 | Haggard et al. | |
| 5,882,694 A | 3/1999 | Guillemette | |
| 6,109,006 A | 8/2000 | Hutchinson | |
| 6,191,074 B1* | 2/2001 | Ravi-Chandar | H01L 39/248 264/177.11 |
| 6,676,835 B2 | 1/2004 | O'Connor et al. | |
| 6,981,552 B2 | 1/2006 | Reddy et al. | |
| 7,090,479 B2 | 8/2006 | Kegasawa et al. | |
| 7,690,908 B2 | 4/2010 | Guillemette et al. | |
| 7,700,019 B2 | 4/2010 | Lavoie et al. | |
| 7,765,949 B2 | 8/2010 | Fork et al. | |
| 7,780,812 B2 | 8/2010 | Fork et al. | |
| 7,799,371 B2 | 9/2010 | Fork et al. | |
| 7,883,670 B2 | 2/2011 | Tonkovich et al. | |
| 7,922,471 B2 | 4/2011 | Fork et al. | |
| 7,988,746 B2 | 8/2011 | Chiang et al. | |
| 8,148,009 B2 | 4/2012 | Chiang et al. | |
| 8,168,326 B2 | 5/2012 | Chiang et al. | |
| 8,206,025 B2 | 6/2012 | Natarajan | |
| 8,206,468 B2 | 6/2012 | Chiang et al. | |
| 8,206,469 B2 | 6/2012 | Chiang et al. | |
| 8,241,789 B2 | 8/2012 | Chiang et al. | |
| 8,277,975 B2 | 10/2012 | Chiang et al. | |
| 8,586,238 B2 | 11/2013 | Chiang et al. | |
| 2002/0074972 A1 | 6/2002 | Narang et al. | |
| 2002/0176538 A1 | 11/2002 | Wimberger-Friedl et al. | |
| 2002/0197535 A1 | 12/2002 | Dudley et al. | |
| 2003/0111762 A1 | 6/2003 | Floyd et al. | |
| 2003/0189758 A1 | 11/2003 | Baer et al. | |
| 2005/0074220 A1 | 4/2005 | Rey | |
| 2006/0038310 A1 | 2/2006 | Lipson | |
| 2006/0040830 A1 | 2/2006 | Thieme et al. | |
| 2006/0073975 A1* | 4/2006 | Thieme | H01L 39/143 505/125 |
| 2006/0258539 A1 | 11/2006 | Matsumoto et al. | |
| 2007/0279839 A1 | 12/2007 | Miller | |
| 2008/0020137 A1* | 1/2008 | Venkataramani | B82Y 30/00 427/215 |
| 2008/0102558 A1 | 5/2008 | Fork et al. | |
| 2008/0161189 A1* | 7/2008 | Lewis | H02K 16/02 505/121 |
| 2010/0003603 A1 | 1/2010 | Chiang et al. | |
| 2010/0190649 A1* | 7/2010 | Doll | H01L 39/02 505/220 |
| 2010/0239700 A1 | 9/2010 | Winroth | |
| 2011/0064999 A1 | 3/2011 | Chiang et al. | |
| 2011/0070489 A1 | 3/2011 | Chiang et al. | |
| 2011/0110836 A1 | 5/2011 | Rong et al. | |
| 2011/0278170 A1 | 11/2011 | Chiang et al. | |
| 2012/0153211 A1* | 6/2012 | Fork | H01B 1/00 252/62.2 |
| 2012/0156364 A1 | 6/2012 | Fork et al. | |
| 2016/0322131 A1 | 11/2016 | Rao et al. | |

FOREIGN PATENT DOCUMENTS

| | | |
|---|---|---|
| EP | 2056352 | 5/2009 |
| EP | 2466594 | 6/2012 |
| FR | 1308573 | 11/1962 |
| FR | 1384293 A | 1/1965 |
| JP | 9183147 | 7/1997 |
| JP | 2006326891 | 12/2006 |
| WO | 0121688 | 3/2001 |

OTHER PUBLICATIONS

European Search Report, dated Apr. 14, 2014, EP Application No. 13198599.6, 7 pages.

Fergus et al., "Recent Developments in Cathode Materials for Lithium Ion Batteries," Journal of Power Sources, Elsevier SA, Ch. vol. 195, No. 4, Feb. 15, 2010, pp. 939-954, XP026693512.

* cited by examiner

CO-EXTRUSION PRINTING OF FILAMENTS FOR SUPERCONDUCTING WIRE

RELATED APPLICATIONS

This application is a divisional of, and claims priority to, U.S. patent application Ser. No. 14/699,936, filed Apr. 29, 2015, which is incorporated herein by reference in its entirety.

TECHNICAL FIELD

This disclosure relates to superconductors, more particularly to co-extruded superconducting filaments or wires.

BACKGROUND

Many types of superconducting devices require superconducting wires or filaments with sub-50 micron sizes for operational performance reasons. Superconducting wires and filaments with these small dimensions lead to significantly lower AC losses and reduced error fields caused by persistent magnetizations currents. Developing superconducting wire architectures with these sub-50 micron sizes at relatively low cost would benefit a wide variety of devices and applications. Some common types of applications in the commercial electric power industry where these types of superconducting wires and filaments would be useful include but are not limited to: motors, generators, transformers, fault-current limiters, AC and DC cables, among other types of electrical power equipment.

Superconducting wires and filaments with sub-50 micrometer sizes would also be beneficial in the fabrication of medical devices including but not limited to: Magnetic Resonance Imaging (MRI) magnets, and Nuclear Magnetic Resonance (NMR) magnets, among other types of medical imaging devices. Superconducting wires and filaments with sub-50 micrometer sizes would also be beneficial in the fabrication of accelerator magnets for high energy physics and fusion energy magnets. In these types of superconducting magnets, fast ramping of currents and hence magnetic fields can lead to excessive AC loss as well as error magnetic fields.

Small filament sizes of the superconducting wires leads to reduced losses and reduced error fields, which simultaneously benefit spatial magnetic field homogeneity and temporal stability. For military type applications there exists a wide variety of applications where sub-50 micron sized superconducting wires or filaments would be beneficial including but not limited to: electrical bus bars, current leads, data and power transmissions cables, mine sweeper magnets, AC and DC cables, electromagnetic rail guns, magnetic energy storage, among other types of military applications.

In applications such as motors and generators, current superconducting machines focus on 'hybrid' AC synchronous machines. In these machines, the rotor is typically superconducting but the stator will consist of conventional non-superconducting copper coils, which is why they are referred to as hybrid machines. While these hybrid machines have considerable performance improvements over their conventional non-superconducting counter-parts, fully superconducting machines would achieve further reductions in weight and size with improved energy efficiency. While some fully superconducting machines exist, their manufacture remains prohibitively complicated and expensive.

Economically viable superconducting materials typically cannot perform adequately under the high magnetic fields and standard AC power frequencies (50-60 Hz) required in the stator. High speed motors and generators require even higher frequency operation up to 400 Hz, exacerbating the problem of excessive AC loss. Current high temperature superconducting (HTS) materials such as first generation BSCCO (bismuth strontium calcium copper oxide) powder-in-tube (PIT) and second generation YBCO (yttrium barium copper oxide) have inherently high losses under AC excitation. Other low temperature superconductors (LTS) such as NbTi (niobium titanium) and $Nb_3Sn$ (niobium tin) are too expensive to fabricate and operate to achieve widespread market penetration.

Magnesium diboride ($MgB_2$) is a relatively new superconducting material that has the potential to overcome these limitations. $MgB_2$ has low cost, relatively high critical temperature ($T_c$), and sustained performance under high magnetic fields. The high critical temperature ($T_c$~39 K) is above well above the boiling point of costly liquid helium (~4.2 K at atmospheric pressure). Unlike YBCO and BSCCO, $MgB_2$ does not require a high degree of grain-grain alignment, does not show weak-link behavior, and has strong performance under high magnetic fields.

Known methods for fabricating $MgB_2$ cannot achieve the fine filament sizes of less than 50 microns needed to support high frequency operation. Volume production of $MgB_2$ has been accomplished using traditional metallurgical techniques based upon ex-situ PIT or continuous tube forming and filing (CTFF) process. This approach has significant drawbacks, namely inefficient use of the $MgB_2$ fiber and resulting in lower and expensive multifilament wire fabrication. Most importantly, this method can only achieve sub-mm filament sizes, rather than the sub-50 micrometer sizes needed.

SUMMARY

An embodiment comprises a method of manufacturing a superconducting tape, including forming a slurry of superconducting material, forming a slurry of sacrificial material, extruding the slurries of superconducting and sacrificial materials as interdigitated stripes onto a substrate, and removing the sacrificial material to form superconducting filaments separated by gaps.

DETAILED DESCRIPTION OF THE EMBODIMENTS

As discussed above, many areas and applications would benefit from sub-50 micron superconducting wires. These range from the electric power industry to medical devices. For ease of understanding, the discussion below focuses on synchronous AC machines to provide a comparison between current hybrid machinery and fully superconducting machinery. This discussion merely serves as an example and is in no way intended to limit application of the embodiments of the invention as claimed, which are directed to sub-50 micron superconducting wire filaments and the methods of their manufacture.

The commercial value of fully superconducting topologies for applications such as large power plant generators, which already operate at high efficiencies, is primarily driven by capital efficiency during construction through reduced generator sizes. This leads to smaller footprints and less supporting infrastructure. Some applications like large wind turbines over 10 MW, could see dramatic reductions in size and weight that will increase economic viability and lead to greater adoption. The reduction in size and weight comes from superconductors that can generate the same amount of power with less material. The below table provides a comparison.

| Machine Type | Permanent Magnet | Hybrid Super-conducting | Fully Super-conducting |
|---|---|---|---|
| Power (MW) | 41 | 41 | 41 |
| RPM | 720 | 720 | 720 |
| Material rotor/stator | Permanent magnet/Cu | YBCO/Cu | $MgB_2/Nb_3Sn$ |
| Top Rotor(K)/Stator(K) | 300/420 | 30/400 | 20-30/10 |
| Mass (kg) | 27,000 | 10,000 | 3,800 |
| Specific torque (Nm/kg) | 20 | 55 | 140 |
| Net machine efficiency (@ 15% of Carnot) | 94% | 97% | 99% |

As used here, the term 'superconducting,' 'superconductor,' 'superconductive,' etc., refers to a material that has zero electrical resistance when cooled below a critical temperature $(T_a)$ and a complete ejection of magnetic field lines as the material enters the superconducting state.

The term 'motor' may be used as an example of a synchronous AC machine, with the understanding that the embodiments here apply to generators as well. No limitation to either motors or generators is intended, nor should it be implied. In addition, the embodiments here may also apply to induction motors, depending upon the selection of materials.

Figure 1:
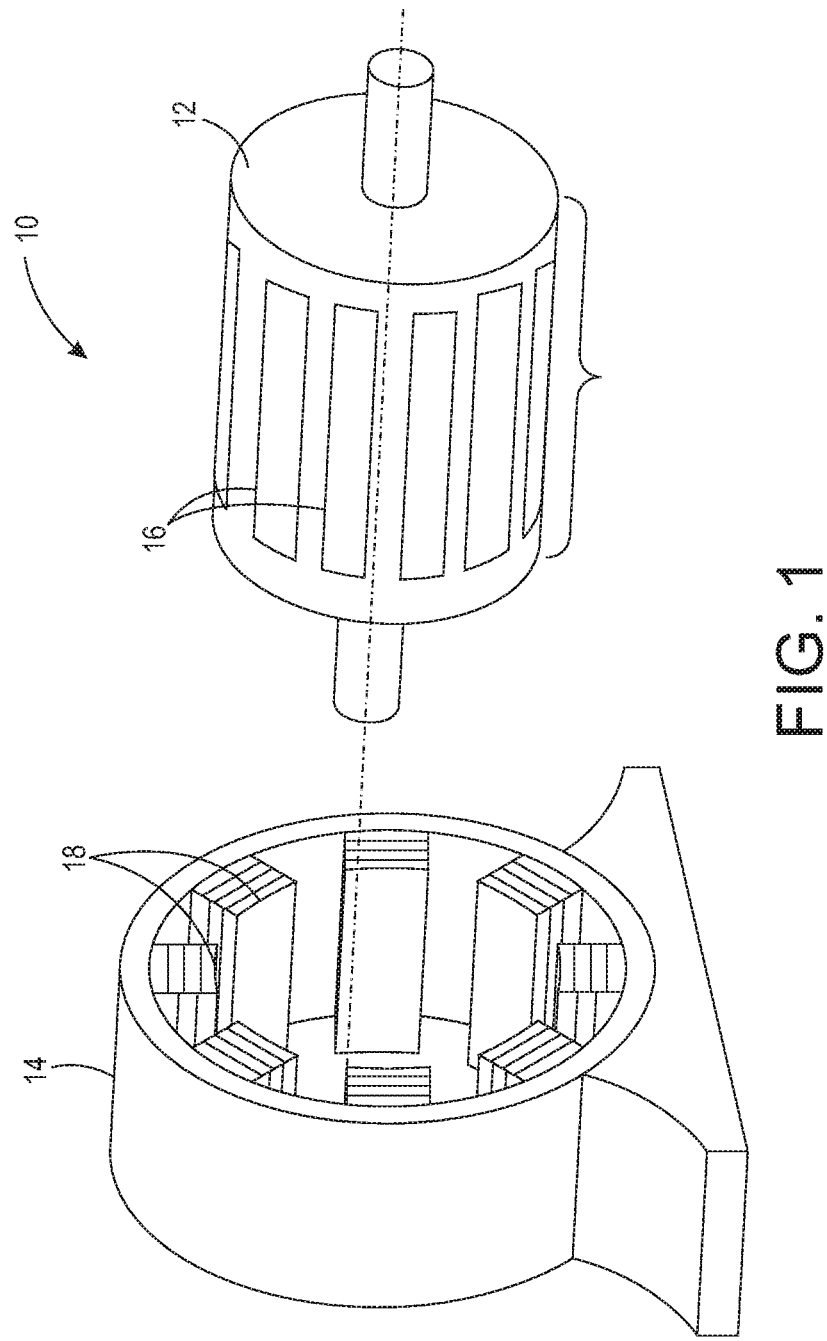
FIG. 1 shows an embodiment of a superconducting synchronous machine.

FIG. 1 shows an example of a synchronous machine 10. The synchronous machine has a rotor 12 and a stator 14. One should note that the example shown is for a mounted motor rather than a turbine generator. The rotor 12 typically has electromagnets or other active materials 16, and the stator has similar elements 18. In most cases these electromagnets take the form of 'windings' or coils of copper wire or other materials that provide the magnet poles. It is in these windings where the superconductive materials reside.

One of the challenges lies in high frequency operation. High frequency operations require filaments or wires that are sub-50 micrometers, and current manufacturing techniques for the filaments can only reach the sub-millimeter range. Other challenges include manufacturability and expense. None of the current processes can manufacture these filaments easily and the resulting processes are too expensive to make the filaments cost effective.

Figure 2:
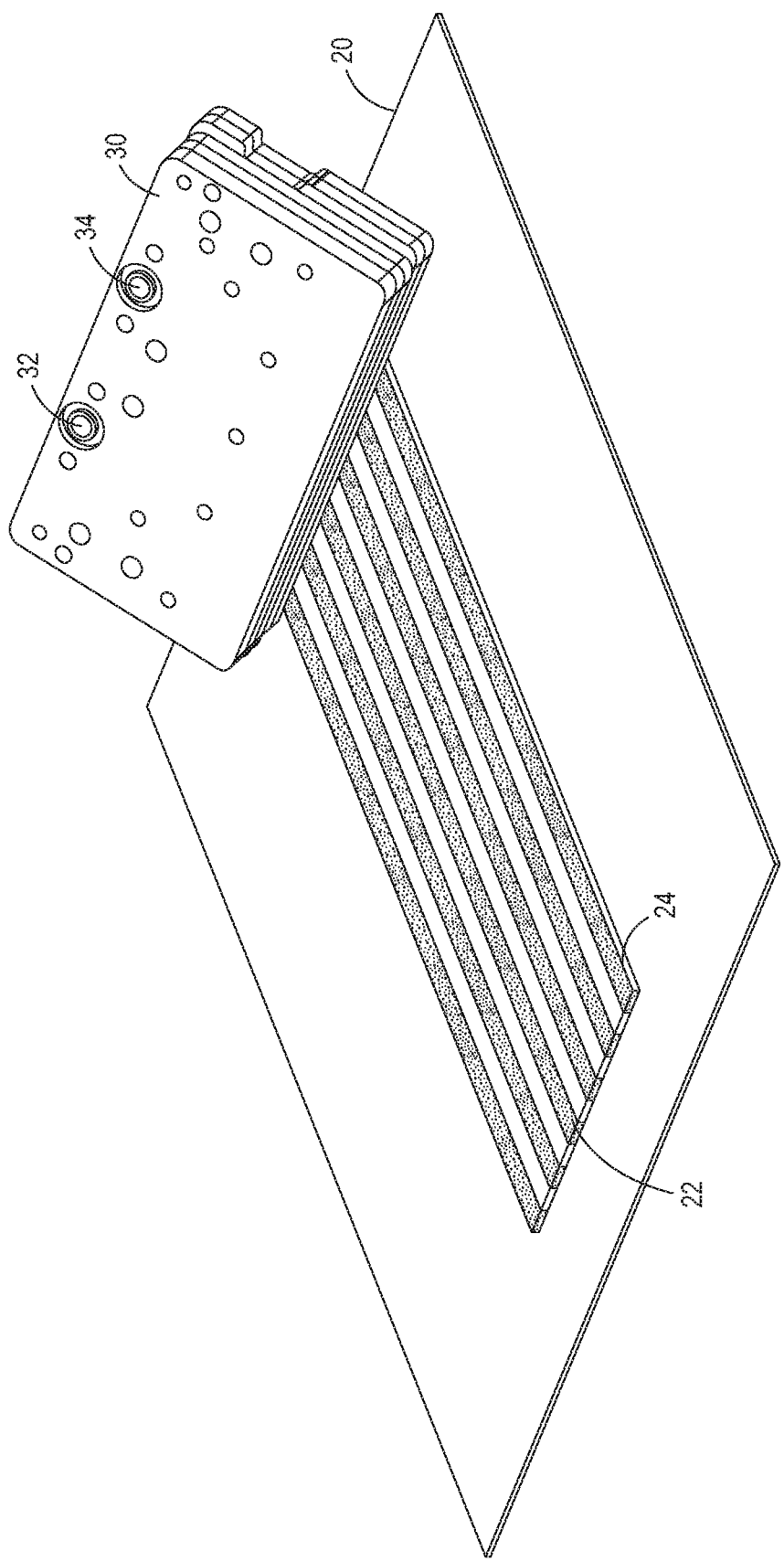
FIG. 2 shows a structure of superconducting stripes extruded using a co-extrusion print head.

FIG. 2 shows an embodiment of a co-extrusion head depositing interdigitated stripes of superconducting paste and a sacrificial material. The co-extrusion head may be referred to as a co-extrusion print head, as the process of feeding the slurries of materials and the motion of the head is similar to printing processes. Different embodiments of the co-extrusion head are discussed in U.S. Pat. Nos. 9,004,001 and 9,012,090 and US Patent Publication Nos. 20140186697, 20140186519, and 20150056432 all of which are incorporated by reference here in their entirety.

Essentially, two or more slurries or pastes are fed into the print head and then flowed into adjacent paths so the materials form adjacent stripes. For ease of discussion only two materials will be discussed. The flow of two adjacent stripes is then split vertically and rejoined laterally to form four stripes of alternating materials. The slurries are typically formulated so they do not mix when they come into contact with the other slurries. The vertically splitting and lateral joining can be repeated several times, resulting in a final flow if interdigitated stripes of materials, where each stripe of material forms a fine filament.

In FIG. 2, the co-extrusion head 30 receives two different materials through ports 32 and 34. It must be understood that the head may have more ports to receive more materials or to receive addition slurries of the same materials. The splitting and rejoining of the flows occur inside the co-extrusion head, the details of which are beyond the scope of this disclosure. The head deposits the resulting flow of interdigitated stripes on a substrate. In this particular embodiment, the substrate consists of a thin metal substrate like a metal foil, but other types of substrates may be used provided they can withstand the further processing.

In the embodiment of FIG. 2, one of the materials is a superconducting paste of magnesium diboride ($MgB_2$) and the other material is a sacrificial material. The superconducting material forms stripes such as 24 and the sacrificial material forms stripes such as 22.

Figure 3:
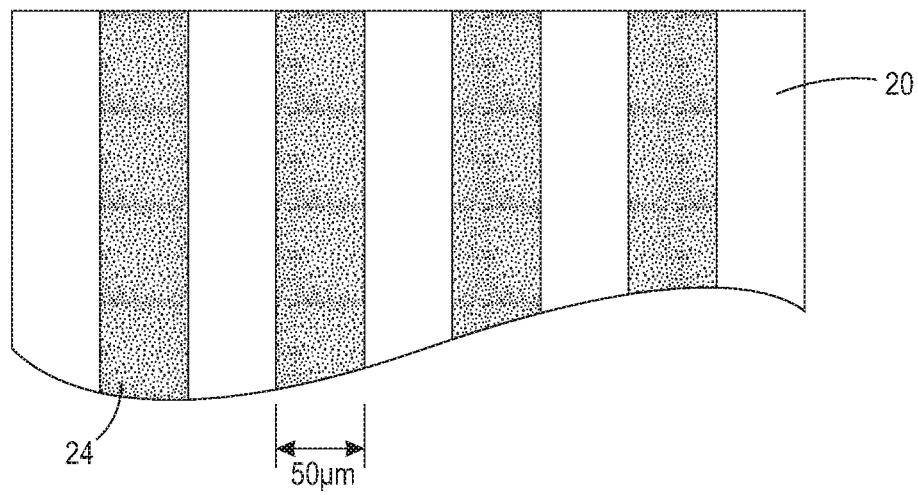
FIG. 3 shows a more detailed view of superconducting stripes.

After deposition of the slurries, the substrate and slurries undergoes heating to remove the excess liquid. The sacrificial material also undergoes removal, which may occur during heating or during a different process such as cleaning with a solvent, etc. FIG. 3 shows the resulting filaments of superconducting material 24 on the substrate 20. The gaps between the stripes are the regions from which the sacrificial material has been removed, leaving the substrate exposed. Each stripe of superconducting material has a width of less than 50 micrometers (μm). The thin metal foil with the superconducting filaments may be referred to as superconducting tape, as the foil has high enough flexibility that it can wrap around objects or be formed into winding structures like tape.

Figure 4:
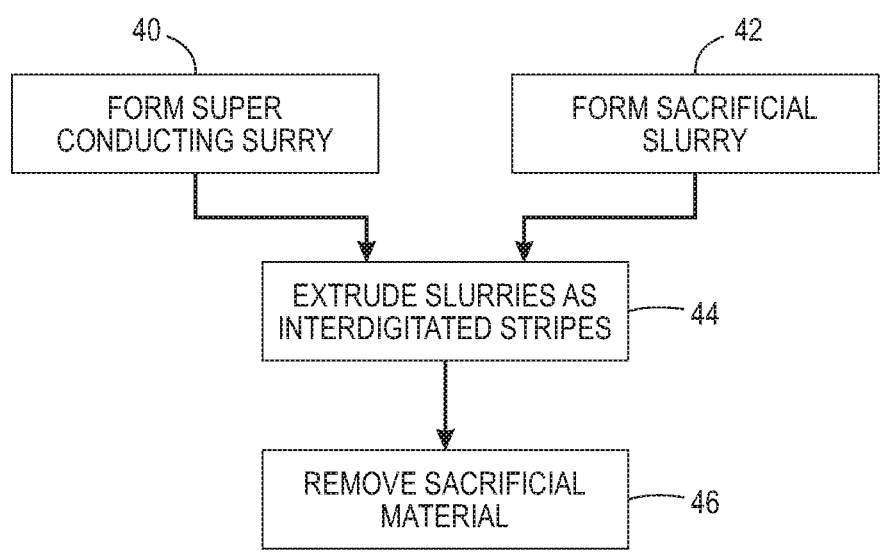
FIG. 4 shows a flowchart of a method of manufacturing a structure having superconducting stripes.

FIG. 4 shows a flowchart of an embodiment of a method of manufacturing the superconducting filaments. At 40, the superconducting material is formed into a first slurry. In one embodiment, the superconducting material takes the form of $MgB_2$ powder. Mixing the powder into an organic solvent forms a slurry or paste of the material. The slurry may contain other components such as a binder and chemical dopants such as carbon, silicon carbide, among other chemical dopants. Chemical dopants have been shown to enhance the flux pinning in the $MgB_2$ superconducting wires or filaments. Increasing the flux pinning force in superconductors enhances the current carrying capacity of the wire in the presence of external magnetic fields. The organic solvent may consist of many different types of solvents such as butyl carbitol or toluene. At 42, a sacrificial material is formed into a second slurry. In one embodiment, this may consist of a cellulose binder mixed into an organic solvent or binder.

As will be discussed below, one or more layers may reside on the substrate prior to the deposition of the slurries. These optional layers will be deposited onto the substrate by one of many possible processes including sputtering, slot coating, vapor deposition, etc., prior to the extrusion of the slurries.

One embodiment of the process is to print a stripe of $MgB_2$ slurry, supported by stripes of sacrificial vehicle on both sides. This will be referred to as an "ex-situ" process, because the $MgB_2$ is synthesized outside of the printhead, then ground up into particles, then turned into ink. In another embodiment of an in-situ process the process takes magnesium particles and boron particles, mix them together in the correct proportion, make an ink out of the mixture, and prints the same structure. Then, during the sintering process there is a reaction that turns the magnesium and boron powders into $MgB_2$. The "in-situ" process forms the $MgB_2$ after deposition.

A third embodiment is to print three materials at once, such that each line is (Sacrificial ink)||(Mg slurry)||(B Slurry) ||(Sacrificial ink). Then, during the reaction process, the Mg diffuses into the B side to form the compound $MgB_2$. This is also an in-situ process, but may require a different printhead than that shown in FIG. 2, as it would need a third port and path for a third fluid.

However the slurries are formed, they are extruded onto a substrate at 44. One must note that other slurries may be used in addition to the two slurries. Formation of three or more stripes of materials may provide wider separation between the stripes of superconducting material, for example, or serve other functions. The additional slurries may consist of a different or the same sacrificial material.

Once the slurries have been deposited, the sacrificial material is removed at 46. In one embodiment, the removing of the sacrificial material takes the form of heating the substrate to a temperature in the range of 700-800° C. In this embodiment, this serves to remove the sacrificial material and its slurry, to remove excess liquid from the superconducting slurry, and sinter the superconductor particles, causing the superconducting material to become more dense and solid.

These two processes, removal of the excess liquid from the superconducting slurry and the removal of the sacrificial material may involve two processes. The removal of the excess liquid may result from heating, drying or pressing the superconducting slurry as a separate process from the removal of the sacrificial material. The sacrificial material may be removed with a solvent or some type of mechanical process that does not affect the stripes of superconducting material. However, the heating process performs both of these tasks at one time and is more efficient.

In one embodiment the process dries and sinters the film in two processes. If, for instance, the solvent was butyl carbitol (diethylene glycol butyl ether), which has a boiling point of 230° C., the process would heat the printed film up to ~150° C. to let the film evaporate. A later process then sinters the film at 700-800° C. In an industrial setting, this may be done in one process in a conveyer-belt style oven, and this long oven would have a number of different heating zones, the first two of which would be longer and lower temperature to give the film time to dry before densification.

Another consideration in forming the superconducting wires is coating or passivation, such as for heat management. The filaments produced by the above process will be flat, and after deposition and drying/sintering, there may be a need to coat them with some sort of metal. The materials of the superconducting filaments may microquench under the high magnetic fields typical inside superconducting machines. In order to avoid this, a layer of metal, such as copper, may be deposited over the filaments. Deposition may occur by one of many processes, including sputtering.

Figure 5:
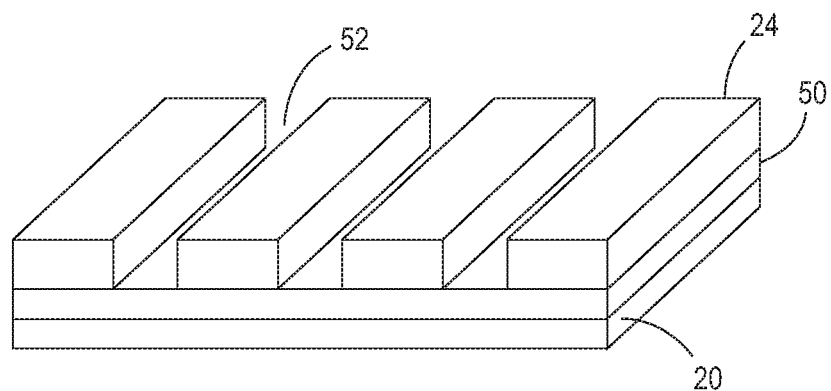
FIGS. 5 and 6 show alternative embodiments of a structure having superconducting stripes.
Figure 6:
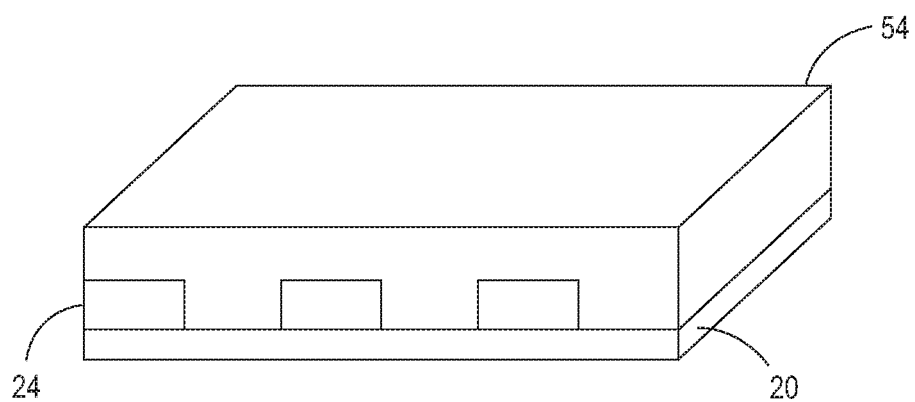

FIGS. 5 and 6 show alternative embodiments of the superconducting filament tapes or structures. As shown in FIG. 5, the structure has a metal substrate 20, buffer layer or layers 50 on the metal substrate, and stripes of superconducting material 24 on the buffer layer or layers, wherein each stripe is separated from adjacent stripes by a gap 52. In this embodiment, the buffer layer or layers 50 provides many useful and beneficial functions including but not limited to a chemical barrier layer to prevent poisoning during heat treatment, better coefficient of thermal expansion matching between the metal substrate and the superconducting stripes, a means for chemically doping the $MgB_2$ for improved performance, electrical insulation, etc.

FIG. 6 shows a structure having a metal substrate 20, and stripes of superconducting material 24 on the metal substrate, wherein each stripe is separated from adjacent stripes by a gap. In this embodiment, an additional layer 54 of metallic material such as copper, silver, aluminum, gold, nickel, tin, alloys and mixtures thereof, etc. is placed on top of the superconducting filaments to provide an electric and thermal stabilizer. This layer may also consist of an electrical insulator, discussed below, as well as a combination of the two.

Alternatively, the structure has a metal substrate with a buffer layer as in FIG. 5, but in this embodiment the buffer layer consists of an electrically insulating buffer layer on the metal substrate, and the stripes of superconducting material reside on the electrically insulating buffer layer. In this embodiment, an additional layer of material resides on top of the superconducting filaments as shown in FIG. 6, but the layer consists of an electrically insulating material to provide electrical isolation between the superconducting filaments.

Other modifications exist, including use of a non-metallic substrate such as SiC (silicon-carbide), carbon (C), graphene, alumina, sapphire, etc., and stripes of superconducting material on the non-metallic substrate, wherein each stripe is separated from adjacent stripes by a gap.

In this manner, filaments of superconducting material are formed on a thin substrate and the filaments have a width of less than 50 micrometers. This makes them suitable for high frequency operation. Referring back to FIG. 1, the resulting tape substrate can be used to form the windings used on both a stator and a rotor of a synchronous machine, resulting in a highly efficient, fully superconducting machine. The manufacture of the superconducting filaments is relatively simple and much less expensive than the current state of the art manufacturing processes.

It should be noted that either the electrically conducting or electrically non-conducting substrates with the co-extruded superconducting filaments described in this disclosure can be bundled together to comprise a superconducting cable. The advantage of bundling multiple superconducting tapes in parallel is for enhanced current carrying capacity when compared with a single superconducting tape. Furthermore, it may be advantageous to twist and transpose these bundled superconducting tapes for further reductions in AC loss of the superconducting cable.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method of manufacturing a superconducting metal tape, comprising:

synthesizing a superconducting material external to a print head;
forming a slurry of the superconducting material;
forming a slurry of sacrificial material;
depositing the slurries of superconducting material and the sacrificial material as one flow of multiple interdigitated stripes of each material onto a metal substrate using the print head, wherein the slurry of superconducting material and the slurry of sacrificial material are formulated so the slurries avoid mixing when the slurries come into contact;
sintering the slurries; and
removing the sacrificial material to form superconducting filaments.

2. The method of claim 1, wherein forming the slurry of superconducting material comprises mixing a powder of the superconducting material into an organic solvent with a binder.

3. The method of claim 2, wherein mixing the powder into an organic solvent comprises mixing magnesium diboride powder into butyl carbitol.

4. The method of claim 2, wherein mixing the powder into an organic solvent comprises mixing magnesium diboride powder and chemical dopants into butyl carbitol.

5. The method of claim 1, wherein forming a second slurry of sacrificial material comprises mixing a binder into a solvent.

6. The method of claim 5, wherein mixing a binder into a solvent comprises dissolving a cellulose binder into an organic solvent.

7. The method of claim 1, further comprising forming the metal tape into a rotor for a synchronous machine.

8. The method of claim 1, wherein sintering the slurries also removes the sacrificial material and comprises heating the substrate and slurries to a temperature in the range of 700–800° C.

9. The method of claim 1, further comprising sintering the slurry of superconducting material separately from removing the sacrificial material.

10. The method of claim 1, further comprising coating the substrate with a buffer layer prior to depositing the slurries.

11. The method of claim 1, further comprising coating the stripes of superconducting material with a top layer.

12. The method of claim 1, wherein forming the slurry of superconducting material comprises forming the slurry of superconducting material including dopants selected to enhance the flux pinning of the superconducting material.

13. A method of manufacturing a superconducting metal tape, comprising:
forming a slurry of a first material;
forming a slurry of a second material;
forming a slurry of sacrificial material;
depositing the slurries of the first material, the second material, and the sacrificial material, as one flow of multiple interdigitated stripes of each material onto a substrate, wherein the slurries of the first material and the second material are formulated to allow them to react and form a superconducting compound after depositing; and
removing the sacrificial material to form superconducting filaments.

14. A method of manufacturing a superconducting metal tape, comprising:
forming a slurry of a first material by mixing powders of two different materials;
forming the slurry of a sacrificial material;
depositing the slurries of the first material and the sacrificial material, as one flow of multiple interdigitated stripes of each material onto a substrate; and
sintering at least the slurry of the first material, wherein the slurry of the first material is formulated to allow the powders to form a superconducting compound during sintering.

* * * * *